US009169920B2

(12) United States Patent
Brammer

(10) Patent No.: US 9,169,920 B2
(45) Date of Patent: Oct. 27, 2015

(54) TRANSMISSION CONTROLLER CONTACTING MODULE, AND MANUFACTURING METHOD

(75) Inventor: Christian Brammer, Bergen (DE)

(73) Assignee: WABCO GmbH, Hannover (DE)

( * ) Notice: Subject to any disclaimer, the term of this patent is extended or adjusted under 35 U.S.C. 154(b) by 910 days.

(21) Appl. No.: 13/393,677

(22) PCT Filed: Jul. 13, 2010

(86) PCT No.: PCT/EP2010/004242
§ 371 (c)(1),
(2), (4) Date: Mar. 1, 2012

(87) PCT Pub. No.: WO2011/032615
PCT Pub. Date: Mar. 24, 2011

(65) Prior Publication Data
US 2012/0166052 A1    Jun. 28, 2012

(30) Foreign Application Priority Data
Sep. 16, 2009 (DE) .......................... 10 2009 041 756

(51) Int. Cl.
| H05K 7/00 | (2006.01) |
| H05K 5/00 | (2006.01) |
| F16H 61/00 | (2006.01) |
| H05K 7/02 | (2006.01) |

(52) U.S. Cl.
CPC ............ *F16H 61/0006* (2013.01); *H05K 7/026* (2013.01); *Y10T 29/49908* (2015.01)

(58) Field of Classification Search
CPC ...... F02D 11/106; G01D 5/145; H05K 7/026; H01R 3/65802

USPC ......... 361/784–804, 668; 174/359, 44, 50.52, 174/50.53, 59, 145
See application file for complete search history.

(56) References Cited

U.S. PATENT DOCUMENTS

| 5,845,544 | A | 12/1998 | Huggins et al. |
| 6,300,565 | B1 | 10/2001 | Loibl et al. |
| 6,515,228 | B2 | 2/2003 | Albert et al. |
| 2004/0129909 | A1* | 7/2004 | Wiese ...................... 251/129.04 |
| 2010/0191427 | A1 | 7/2010 | Brammer et al. |
| 2011/0250790 | A1* | 10/2011 | De Blieck et al. ....... 439/607.01 |

FOREIGN PATENT DOCUMENTS

| DE | 197 01 469 C1 | 8/1998 |
| DE | 197 12 842 C1 | 8/1998 |
| DE | 199 55 603 C1 | 2/2001 |

(Continued)

*Primary Examiner* — Jerry Wu
(74) *Attorney, Agent, or Firm* — Kramer Levin Naftalis & Frankel LLP

(57) ABSTRACT

A contacting module for a transmission controller comprises a module housing and a punched grill. The punched grill is composed of metal, accommodated in the module housing, and has several conducting tracks with free ends. Contact surfaces are formed at the free ends. Free spaces are formed in the module housing and extend through the housing in a substantially vertical direction. At least some of the free ends are arranged at least partially in the free spaces, where the contact surfaces of at least some of the free ends extend substantially in the vertical direction, and where at least some of the free ends are elastically yielding at least in the area of the contact surfaces.

14 Claims, 6 Drawing Sheets

(56) References Cited

FOREIGN PATENT DOCUMENTS

| DE | 697 11 286 | T2 | | 5/2002 |
|---|---|---|---|---|
| DE | 10 2004 062 679 | A1 | | 3/2006 |
| DE | 10 2006 050 429 | A1 | | 4/2008 |
| EP | 1 186 478 | A2 | | 3/2002 |
| JP | 2004 208465 | A | | 7/2004 |
| JP | 2004208465 | A | * | 7/2004 |

* cited by examiner

TRANSMISSION CONTROLLER CONTACTING MODULE, AND MANUFACTURING METHOD

FIELD OF THE INVENTION

The present invention generally relates to embodiments of a contacting module for a transmission controller, a transmission control module and manufacturing methods therefor. The contacting module is configured to interface with an electronic control unit, solenoid valves, and sensors.

BACKGROUND OF THE INVENTION

Contacting modules of the general type under consideration serve as parts of transmission controllers for performing various complex contacting operations. In this context, the electronic control unit is placed in contact with the respective solenoid valves that are to be actuated, and in general with sensors, for example acceleration sensors, rotational speed sensors, and pressure sensors.

The contacting modules are embodied in general with a plastic housing and a line carrier, which is in turn embodied as a flex film or punched grill. Flex films are generally soldered or welded. Contact is conventionally made with punched grills by means of plug-type contacts.

However, contacting devices of this type are generally not without their problems. Soldered connections are inclined to slip under or fail in the case of mechanical loading, in particular mechanical micro-movements. Plug-type connections are subject to wear in the case of mechanical micro-movements, with the result that an oxide layer can form and the ohmic resistance of the contacting device rises. Under certain circumstances, sensor signals can be influenced and falsified, and undesired contact interruptions can occur.

SUMMARY OF THE INVENTION

Generally speaking, it is an object of the present invention to provide a contacting module, and a transmission control module having such a contacting module, which can be produced at relatively low cost and that permits contact to be made securely even in the case of relatively high or relatively complex mechanical loading.

According to an embodiment of the present invention, free spaces that run in the vertical direction, and in which at least some free ends of a punched grill are accommodated, are formed in a module housing. The free ends can project outwardly from the module housing, in particular, in the vertical direction, i.e. upwardly or downwardly, and can make contact with corresponding contact tongues of the relevant components, i.e. the solenoid valves and, if appropriate, sensors. In this context, the contacting module can, for example, be fitted onto the control housing with the pre-mounted components. As a result, the contact tongues of the components pass through the vertical free spaces and remain spaced apart somewhat in the lateral direction with respect to contact surfaces of the free ends of the punched grill. Also, contact tongues of the components and the free ends of the punched grill can subsequently be compressed, for example by a resistance welding device, and placed in contact with one another.

According to another embodiment of the present invention, the free ends are elastically resilient to such an extent that they can be easily placed in contact with the contact tongues. Furthermore, in the case of the movements that occur, in particular the micro-movements, they are elastically resilient and therefore absorb the movements, with the result that the contacting devices, for example the welded connections, are not loaded. In this context, in particular, the free ends can be contoured with a bent and/or curved profile of corresponding conductor tracks.

The module housing can advantageously be embodied as two shells with an upper shell and a lower shell latched to one another. For example, the shells can be clipped to one another, or welded, caulked, stamped or riveted, as appropriate. In this context, the two shells are also held together by the attachment of the module housing to the control housing and the components by means of corresponding screws or the like. With a two-shell construction of this type, the punched grill can firstly be placed in one of the shells, for example the upper shell, and secured, for example, by means of stamping, and subsequently the other shell can be fitted on, wherein the free ends are accommodated in the free spaces and advantageously project upwardly. The contacting module, which is formed cost-effectively and quickly, subsequently permits secure contact to be made in a way that withstands the mechanical loading that occurs, such as micro-movements. For this purpose, a welding device can successively move the contact-forming parties in or above the free spaces and make contact therebetween.

Still other objects and advantages of the present invention will in part be obvious and will in part be apparent from the specification.

The present invention accordingly embodies features of construction, combinations of elements, and arrangement of parts, and comprises the several manufacturing steps and the relation of one or more of such steps with respect to each of the others, all as exemplified in the detailed disclosure hereinafter set forth, and the scope of the invention will be indicated in the claims.

BRIEF DESCRIPTION OF THE DRAWINGS

Exemplary embodiments of the present invention will be explained in greater detail below with reference to the appended drawings, in which.

DETAILED DESCRIPTION OF THE PREFERRED EMBODIMENTS

Figure 1:
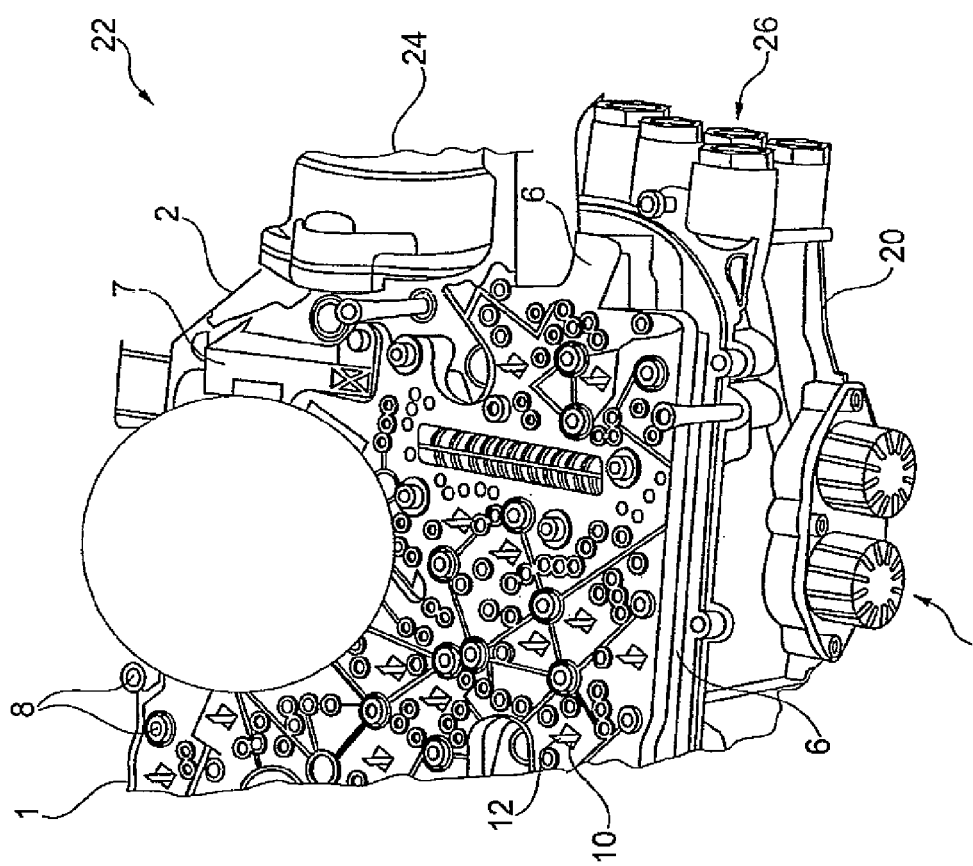
FIG. 1 shows a contacting module attached to a control housing according to an embodiment of the present invention.
Figure 2:
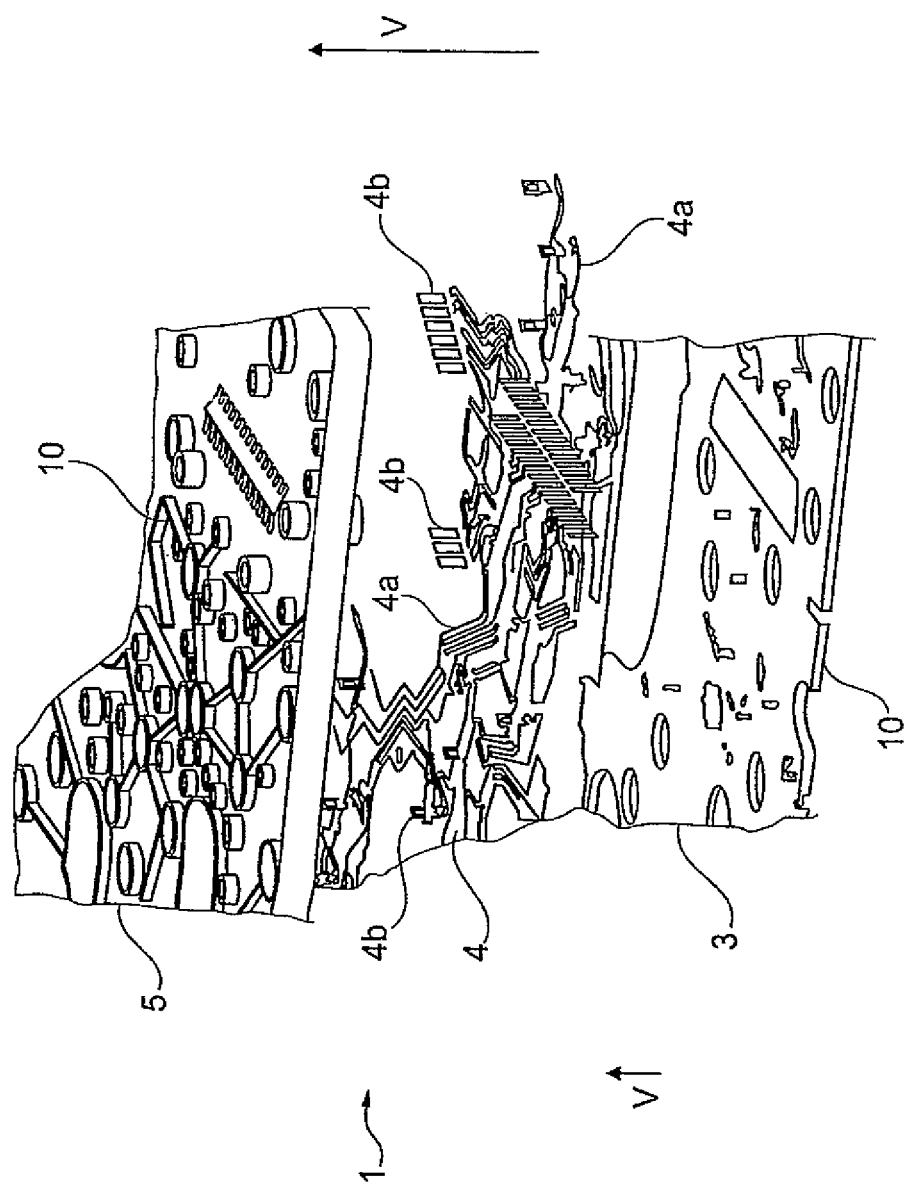
FIG. 2 is an exploded view of the contacting module according to an embodiment of the present invention.

FIG. 2 shows an exploded view of a contacting module 1 according to an exemplary embodiment of the present invention. The contacting module is attachable to a control housing 2, as depicted in FIG. 1. The contacting module 1 has, as shown in FIG. 2, a lower shell 3, a punched grill 4 and an upper shell 5. Shells 3, 5 can each be embodied as plastic parts, for example injection molded parts, and can be latched or clipped to one another, with the result that they securely accommodate the metallic punched grill 4 therebetween.

The punched grill 4 is produced in a known manner by punching out a piece of sheet metal, for example made of bronze, and has conductor tracks 4a and free ends 4b, which serve to make contact and are connected to one another by means of the conductor tracks 4a. The entire contacting module 1 serves to alternately make contact with the connected components, in particular sensors 7, for example pressure sensors or travel sensors, and solenoid valves 6 as well as a control unit (not shown). The attachment of the fitted-together contacting module 1 to the controller housing 2 is shown in FIG. 1, wherein the contacting module 1 is connected both to the solenoid valves 6 and, if appropriate, sensors 7 as well as to the control housing 2 by means of, for example, screws 8. Furthermore, contact is made intermediately by means of the free ends of the punched grill with corresponding contact tongues of the components 6, 7, as described below.

According to the exemplary embodiment of the present invention, free spaces 10 are formed in the two shells 3, 5. The free spaces 10 are aligned with one another and therefore form continuous free spaces 10 in the vertical direction V, which corresponds to the mounting direction. The conductor tracks 4a of the punched grill 4 run essentially within the horizontal plane, wherein the free ends 4b are bent, and the contact surfaces 12 of the free ends are formed in turn in the vertical direction V. Alternatively, if appropriate, the free ends are partially bent with respect thereto, as is shown in detail with respect to FIGS. 3-6. In this context, the free ends are accommodated entirely or mainly in the continuous free spaces 10 and therefore run in the free spaces 10 of the upper shell 5 in the vertical direction and/or also project through. The free ends 4b have novel contouring, which will be described below.

Figure 3:
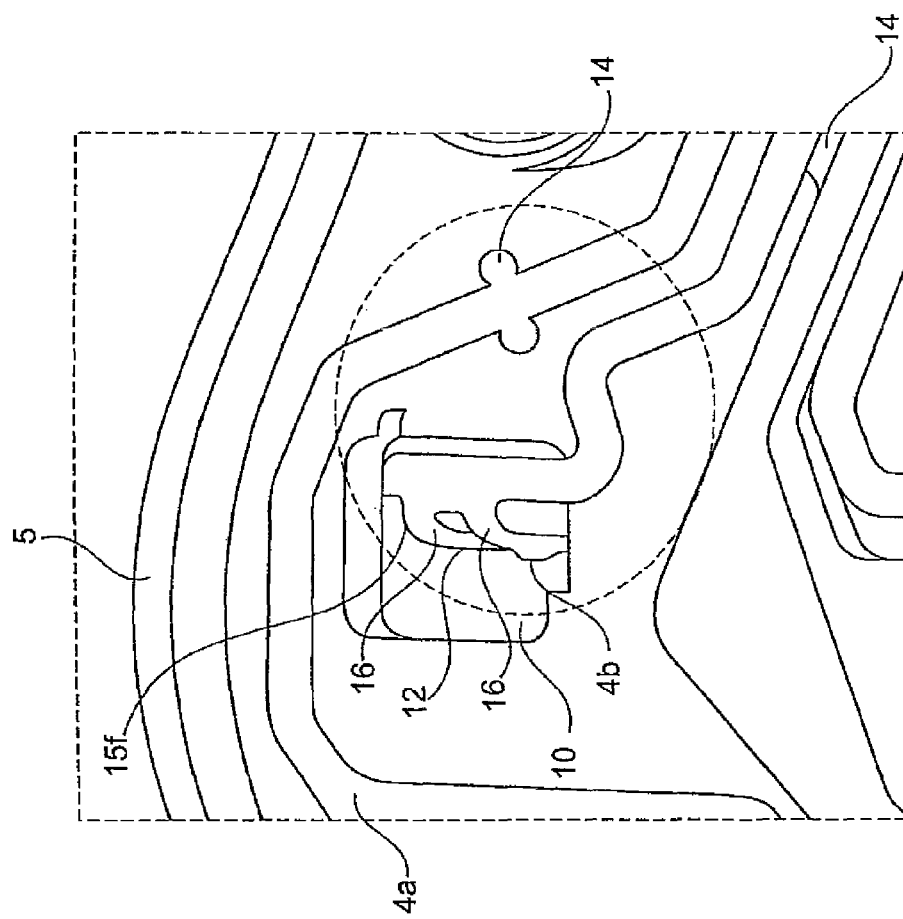
FIGS. 3 and 4 are inner views of a module housing of the contacting module depicting free ends of a punched grill of the contacting module and free spaces of the module housing according to an embodiment of the present invention.
Figure 4:
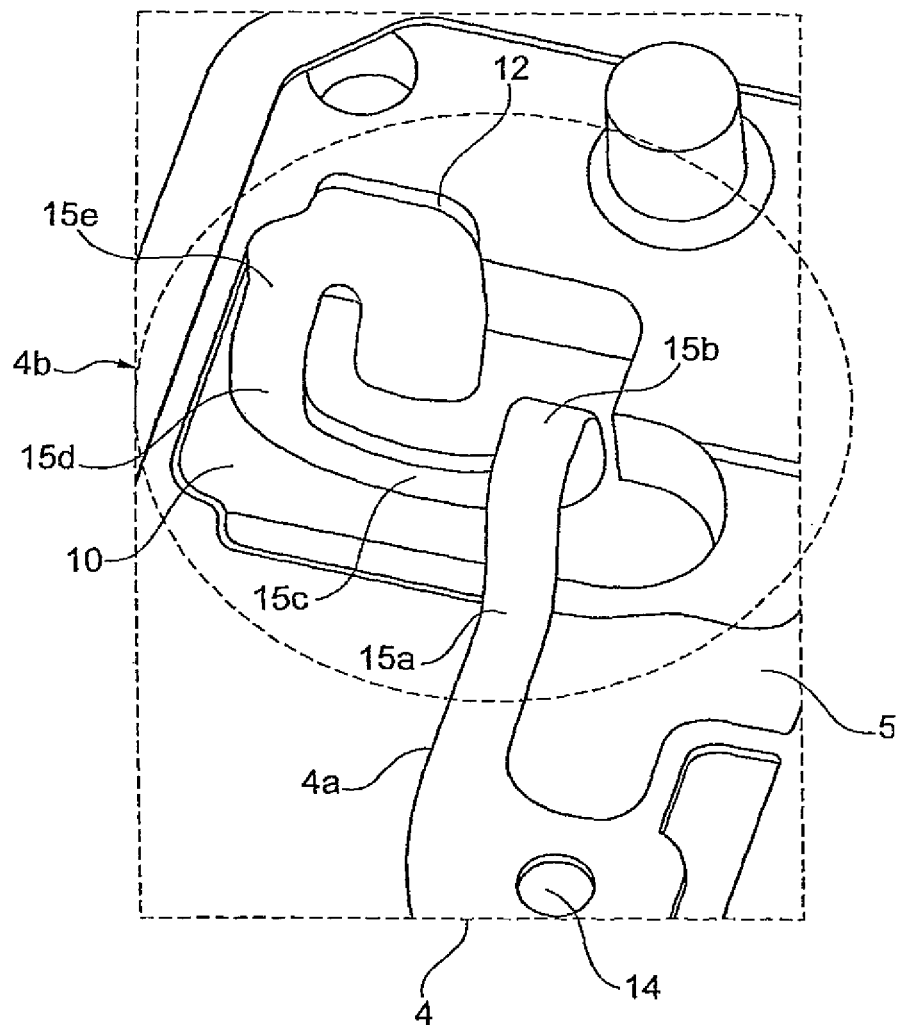

FIGS. 3 and 4 show internal views of the contacting module 1, including views of the lower side of the upper shell 5 after the punched grill 4 has been inserted but before the connection to the lower shell 3. Stamping pins (e.g., plastic knobs) are formed as securing regions 14 on the underside and/or inner side of the upper shell 5. The securing regions are stamped mechanically during or after the insertion of the punched grill 4, for example, as shown in FIG. 4 in the eyes of the punched grill 4 or as shown in FIG. 3 on both sides of the conductor tracks 4a, with the result that after the mechanical stamping or deformation, the punched grill 4 is secured in the upper shell 5. The stamping pins therefore serve as securing regions 14 and are spaced apart from the free ends 4b, with the result that they can be adjusted flexibly.

The free ends 4b can, according to the exemplary embodiment of the present invention, be adjusted in an elastically resilient or flexible fashion owing to their contouring, advantageously in all three spatial directions. As a result, the punched grill 4 can compensate tolerances in all the spatial directions through the flexible embedding in the two shells or half-shells 3, 5. Furthermore, as a result of this connection, the transmission of relative movements from the fixedly embedded regions around the securing regions 14 is reduced. Since the punched grill 4 with its conductor tracks 4a is no longer secured over a large area in the two-shell housing 3, 5, but is instead secured only in the securing regions 14, oscillations induced in the housing 3, 5 are transmitted directly as far as the free ends 4b to a small degree. The punched grill 4 can therefore be adjusted around the securing regions 14 between the shells 3, 5.

Figure 5:
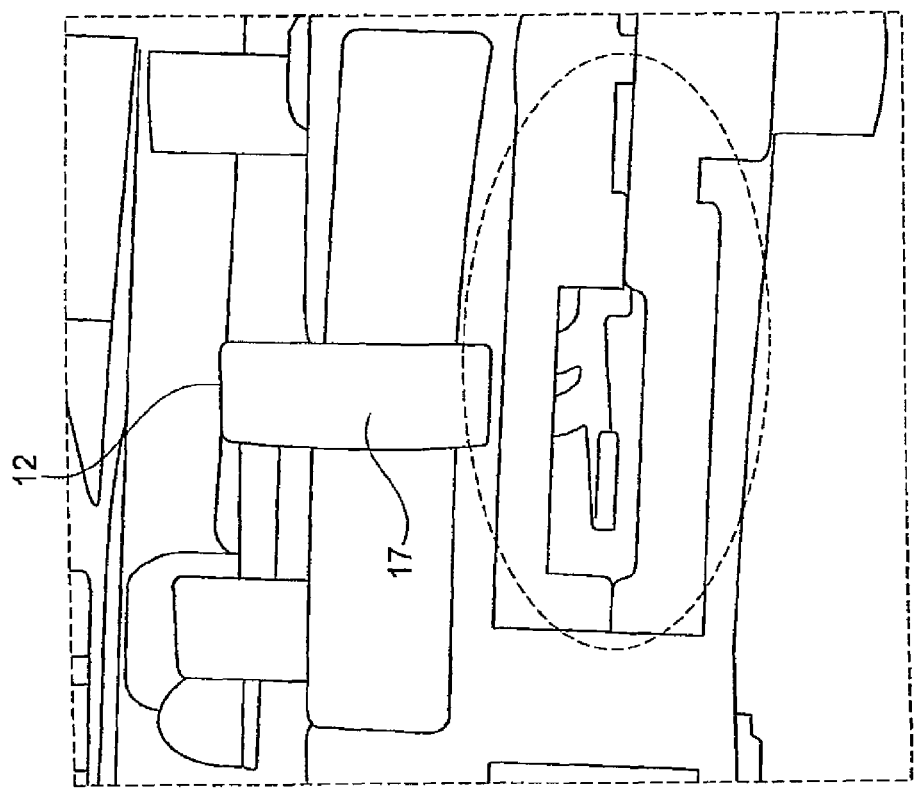
FIG. 5 is a side view of the module housing in the region of a free end of the punched grill according to an embodiment of the present invention.

FIGS. 3, 4 and 5 show various contouring possibilities of the free ends 4b. As shown in FIG. 4, the conductor track 4a runs as far as the free space 10 in the upper plate 5 and then makes a 90° downward bend 15a (upward in FIG. 4) with a first radius, then carries out a 180° upward bend 15b into the free space 10 and/or through the free space 10 with a relatively small radius. As shown in FIG. 4, there is thereafter a lateral adjoining section 15c, i.e., one that extends essentially in the horizontal direction, in which the stamped metallic conductor track of the free end 4b runs in the vertical direction, i.e., is bent with respect to the horizontal run of the conductor tracks 4a. The section 15c makes the subsequent 90° bend 15d, with the result that the stamped conductor track subsequently runs, for example, horizontally again or somewhat obliquely with respect to the horizontal, with a subsequent opposing bend 15e that is adjoined by the contact surface 12, which is widened in order to make contact better. The contact surface 12 can, for example, be bent somewhat at its upper region—the lower region in FIG. 4. Also, contact surface 12 can include a welding dimple 17, for example, for subsequent resistance welding.

FIG. 3 shows a further embodiment in which the conductor track 4a firstly runs, after it is secured in securing regions 14, in the plane of the upper shell 5 with bends, and subsequently extends horizontally as a free end 4b underneath the free space 10, where two webs 16 run, for example, bent in parallel away from the conductor track 4a and upwardly with a 90° bend 15f through the free space 10 of the upper plate 5, wherein the contact surfaces 12 adjoin one another at their upper end. FIG. 5 corresponds to this embodiment.

The free ends 4b can therefore each be formed by subsequently bending the initially planar punched grill 4. The bending of the free ends 4b can occur during the punching process out of a piece of sheet metal as a separate bending process, or else during the stamping of the two shells 3, 5.

The contouring of the free ends 4b therefore permits resilience in the three spatial directions, both during the contacting and also in the case of loading during subsequent operation.

Figure 6:
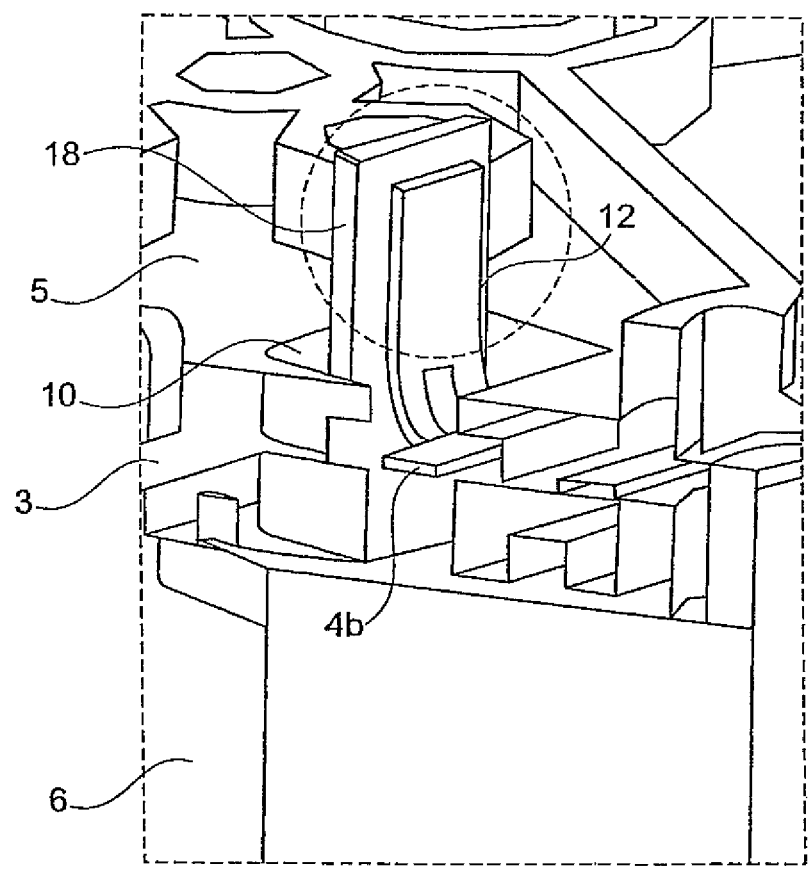
FIG. 6 shows a transmission control module in the region in which contact is made with a free end of the punched grill according to an embodiment of the present invention.

Solenoid valves 6 and sensors 7 are mounted or premounted, partly by means of the screws 8 and/or by means of plug-type contacts, on the control housing 2, as shown in FIG. 1. The contacting module 1 described above is subsequently fitted on and is advantageously attached both to the control housing 2 and to the components, i.e., the solenoid valves 6 and the sensor 7 and, for example, in turn by means of screws 8. The screws 8 can therefore serve to attach the contacting module 1 to both the control housing 2 and the components 6, 7. In this context, as shown in FIG. 1, the contact surfaces 12 of the free ends 4b project upwardly out of the free spaces 10, wherein during the mounting process, the contact tongues 18 pass through the free spaces 10 of the shells 3, 5 and subsequently run parallel to, and somewhat spaced apart from, the contact surfaces 12 of the free ends 4b, as shown in FIG. 6. The welding dimple 17 lies on the side of the contact surface 12 that faces the contact tongue of components 6 or 7. FIG. 6 therefore shows the contacting region between the contact surface 12 and the contact tongue 18 for the subsequent materially joined and/or positively locked connection.

In the embodiment shown, contact is made by means of a welded connection, in particular a resistance welded connection. For this purpose, as shown in FIG. 1, a welding device moves the two welding partners 18, 12 from above in the respective free spaces 10, presses the contact tongue 18 and contact surfaces 12, respectively, together and welds them to one another. Alternatively, positively locking connections are also possible by means of corresponding latches; if appropriate, connections can be made by means of a suitable solder, in particular a high temperature solder or else a conductive adhesive.

The control unit (ECU) is subsequently fitted onto the contacting module 1 from above and can include, for example, a suitable multi-pin connector that is fitted onto a plug receptacle 20 formed in the central right-hand region of the contacting module. The transmission control module 22 is therefore formed and is subsequently fitted onto the respective transmission.

In FIG. 2, pistons 24 and air inlets 25 and air outlets 26 are provided for pneumatic control in a known manner.

It will be seen that the objects set forth above, among those made apparent from the preceding description, are efficiently attained, and since certain changes may be made without departing from the spirit and scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described and all statements of the scope of the invention that, as a matter of language, might be said to fall therebetween.

What is claimed is:

1. A contacting module for a transmission controller, comprising:
    a module housing;
    a punched grill disposed in the module housing, the punched grill having a plurality of conductor tracks with corresponding free ends, each of the free ends comprising a contact surface; and
    a plurality of free spaces extending in a vertical direction through the module housing, wherein:
        at least one of the free ends is disposed at least partially in a corresponding free space of the plurality of free spaces;
        a contact surface of the at least one of the free ends extends substantially in the vertical direction; and
        the at least one of the free ends is elastically resilient at least in an upper region of the respective contact surface.

2. The contacting module as claimed in claim 1, wherein the at least one of the free ends projects out of the housing substantially in the vertical direction at least in the region of the respective contact surface.

3. The contacting module as claimed in claim 1, wherein the at least one of the free ends comprises a curved profile.

4. The contacting module as claimed in claim 1, wherein the at least one of the free ends comprises, in the corresponding free space, a bend substantially in the vertical direction out of a substantially horizontal plane of the punched grill.

5. The contacting module as claimed in claim 1, wherein the at least one of the free ends is defined one of entirely and partially by at least one of a bend and a curved profile of a corresponding one of the conductor tracks, and wherein the contact surface of the at least one of the free ends comprises a widened formation.

6. The contacting module as claimed in claim 1, wherein the at least one of the free ends comprises substantially parallel webs that protrude from a corresponding one of the conductor tracks and that are at least one of curved and bent.

7. The contacting module as claimed in claim 1, wherein the punched grill is bent only at the at least one of the free ends.

8. The contacting module as claimed in claim 1, wherein the housing comprises an upper shell connected to a lower shell connected to one another, wherein the punched grill is disposed between the upper and lower shells, and wherein the plurality of free spaces are formed in the upper and lower shells and are substantially aligned with one another.

9. The contacting module as claimed in claim 8, wherein at least one region of the punched grill is secured to at least one of the upper and lower shells via at least one mechanical stamped element.

10. The contacting module as claimed in claim 9, wherein the punched grill is elastically adjustable between the upper and lower shells in a substantially horizontal plane.

11. The contacting module as claimed in claim 1, wherein the free ends are elastically adjustable in three dimensions at least in the region of the contact surfaces.

12. A transmission control module for a vehicle transmission, comprising:
    a contacting module, comprising:
        a module housing;
        a punched grill disposed in the module housing, the punched grill having a plurality of conductor tracks with corresponding free ends having contact surfaces; and
        a plurality of free spaces extending in a vertical direction through the module housing, wherein:
            at least one of the free ends is disposed at least partially in a corresponding free space of the plurality of free spaces;
            a contact surface of the at least one of the free ends extends substantially in the vertical direction; and
            the at least one of the free ends is elastically resilient at least in the region of the respective contact surface;
    a control housing coupled to the contacting module and having at least one pneumatic cylinder, at least one piston, at least one air inlet, and at least one air outlet thereon;
    at least one solenoid valve having at least one contact tongue in contact with at least one of the free ends of the punched grill;
    at least one sensor attached to the control housing and in contact with the punched grill; and
    an electronic control device coupled to the contacting module.

13. A method for manufacturing a contacting module, the method comprising the steps of:
    forming a punched grill having a plurality of conductor tracks and corresponding free ends, wherein at least one of the free ends is bent in a substantially vertical direction,
    inserting the punched grill into a first shell,
    stamping the first shell to mechanically secure the punched grill; and
    coupling the first shell with a second shell to form a module housing, the module housing comprising a plurality of free spaces that are continuous substantially in the vertical direction through the module housing, and at least one of the free ends being disposed in a corresponding free space of the plurality of free spaces.

14. A method for manufacturing a transmission control module for a vehicle transmission, the transmission control module comprising:
    a contacting module comprising:
        a module housing;
        a punched grill disposed in the module housing, the punched grill having a plurality of conductor tracks with corresponding free ends having contact surfaces; and
        a plurality of free spaces extending in a vertical direction through the module housing, wherein:

at least one of the free ends is disposed at least partially in a corresponding free space of the plurality of free spaces;
a contact surface of the at least one of the free ends extends substantially in the vertical direction; and
the at least one of the free ends is elastically resilient at least in the region of the respective contact surface;
a control housing having at least one pneumatic cylinder, at least one piston, at least one air inlet, at least one air outlet, at least one solenoid valve having contact tongues, and at least one sensor attached to the control housing; and
an electronic control device coupled to the contacting module, the method comprising the steps of: fitting the contacting module onto the control housing such that the contact tongue of the at least one solenoid valve project jointly with the free ends of the punched grill through the plurality of free spaces of the contacting module, and such that the at least one sensor is in contact with the punched grill; and compressing and welding the free ends and the contact tongues to one another.

* * * * *